United States Patent
Sakamoto et al.

(10) Patent No.: US 9,465,054 B2
(45) Date of Patent: Oct. 11, 2016

(54) CURRENT SENSOR

(71) Applicant: Yazaki Corporation, Tokyo (JP)

(72) Inventors: Akinori Sakamoto, Shimada (JP);
Shidi Peng, Shimada (JP)

(73) Assignee: YAZAKI CORPORATION, Tokyo (JP)

( * ) Notice: Subject to any disclaimer, the term of this patent is extended or adjusted under 35 U.S.C. 154(b) by 194 days.

(21) Appl. No.: 13/916,809

(22) Filed: Jun. 13, 2013

(65) Prior Publication Data

US 2013/0335076 A1    Dec. 19, 2013

(30) Foreign Application Priority Data

Jun. 14, 2012    (JP) ................. 2012-135111

(51) Int. Cl.
G01R 33/02    (2006.01)
G01R 19/00    (2006.01)
G01R 15/20    (2006.01)

(52) U.S. Cl.
CPC ............ *G01R 19/00* (2013.01); *G01R 15/207* (2013.01)

(58) Field of Classification Search
CPC .. G01R 33/02; G01R 33/025; G01R 33/032; G01R 33/0327; G01R 33/022; B82Y 25/00
See application file for complete search history.

(56) References Cited

U.S. PATENT DOCUMENTS

| | | | | |
|---|---|---|---|---|
| 8,203,328 B2* | 6/2012 | Bose | ........................ | G01R 1/22 324/117 H |
| 8,237,535 B2* | 8/2012 | Hollevoet | ............. | H01F 27/306 336/200 |
| 2007/0165334 A1* | 7/2007 | Takenaga | ................ | B82Y 25/00 360/313 |
| 2009/0121704 A1* | 5/2009 | Shibahara | ............ | G01R 15/202 324/117 R |
| 2009/0180217 A1* | 7/2009 | Chou | ..................... | B82Y 10/00 360/324 |
| 2010/0188782 A1* | 7/2010 | Yamazaki | .............. | B82Y 10/00 360/294 |
| 2010/0259255 A1* | 10/2010 | Hashio | ................. | G01R 15/207 324/244 |
| 2011/0050222 A1* | 3/2011 | Ueno | ................... | G01R 15/207 324/253 |
| 2011/0121827 A1* | 5/2011 | Yakymyshyn | ....... | G01R 15/207 324/251 |
| 2013/0154617 A1 | 6/2013 | Kawaguchi et al. | | |

(Continued)

FOREIGN PATENT DOCUMENTS

CN    201145706 Y    11/2008
JP    2000-292455 A    10/2000

(Continued)

OTHER PUBLICATIONS

Communication from the State Intellectual Property Office of P.R. China dated May 25, 2015 in a counterpart Chinese application No. 201310233885.5.

(Continued)

*Primary Examiner* — Tung X Nguyen
*Assistant Examiner* — Dominic Hawkins
(74) *Attorney, Agent, or Firm* — Sughrue Mion, PLLC (57) ABSTRACT

A current sensor to be provided in a current path through which current flows includes a housing, a substrate accommodated in the housing, a plurality of magnetic detection elements mounted on the substrate, and a pair of shields respectively disposed on both sides of each magnetic detection element. The shields are accommodated in the housing so as to surround the current path on both sides of the current path and the shields are held so that respective end portions of the shields have a predetermined interval. The magnetic detection elements and the shields are disposed in each phase current path for three-phase AC.

6 Claims, 8 Drawing Sheets

(56) References Cited

U.S. PATENT DOCUMENTS

| | | | | |
|---|---|---|---|---|
| 2013/0162246 A1* | 6/2013 | Nakajima | ............... | G01R 33/09 324/252 |
| 2013/0214593 A1* | 8/2013 | Ohashi | ................. | G01R 15/207 307/10.1 |
| 2014/0253100 A1* | 9/2014 | Lepine | ................... | G01R 19/00 324/126 |

FOREIGN PATENT DOCUMENTS

| | | | |
|---|---|---|---|
| JP | 2005-300170 | A | 10/2005 |
| JP | 2007-113965 | A | 5/2007 |
| JP | 2009-150654 | A | 7/2009 |
| JP | 2009-258048 | A | 11/2009 |
| JP | 20102277 | A | 1/2010 |
| JP | 2010223868 | A | 10/2010 |
| JP | 2012-068154 | A | 4/2012 |

OTHER PUBLICATIONS

Office Action dated Jan. 25, 2016, issued by the State Intellectual Property Office of P.R. China in counterpart Chinese Application No. 201310233885.5.

Notification dated Oct. 8, 2015, issued by the Japanese Patent Office in counterpart Japanese Application No. 2012-135111.

Office Action issued on May 17, 2016, issued by the Japanese Intellectual Property Office in counterpart Japanese Application No. 2012-135111.

Office Action issued on Mar. 15, 2016 by the Japanese Patent Office in counterpart Japanese Application No. 2012-135111.

Office Action dated Jul. 26, 2016 issued by the Japanese Patent Office in counterpart Japanese Patent Application No. 2012-135111.

* cited by examiner

CURRENT SENSOR

CROSS REFERENCE TO RELATED APPLICATION

This application is based on Japanese Patent Applications No. 2012-135111 filed on Jun. 14, 2012, the contents of which are incorporated herein by reference.

BACKGROUND OF THE INVENTION

1. Technical Field

The present invention relates to a current sensor which detects the current of each phase of three-phase alternating current and is, in particular, characterized by the structure of a shield.

2. Background Art

A current sensor has been known which detects the current flowing through a current path (for example, a bus bar, etc.) for connecting an in-vehicle battery of a vehicle and electrical equipment of a vehicle to each other. An example of such a current sensor is illustrated in FIG. 8 (see JP-A-2010-223868).

Figure 8A:
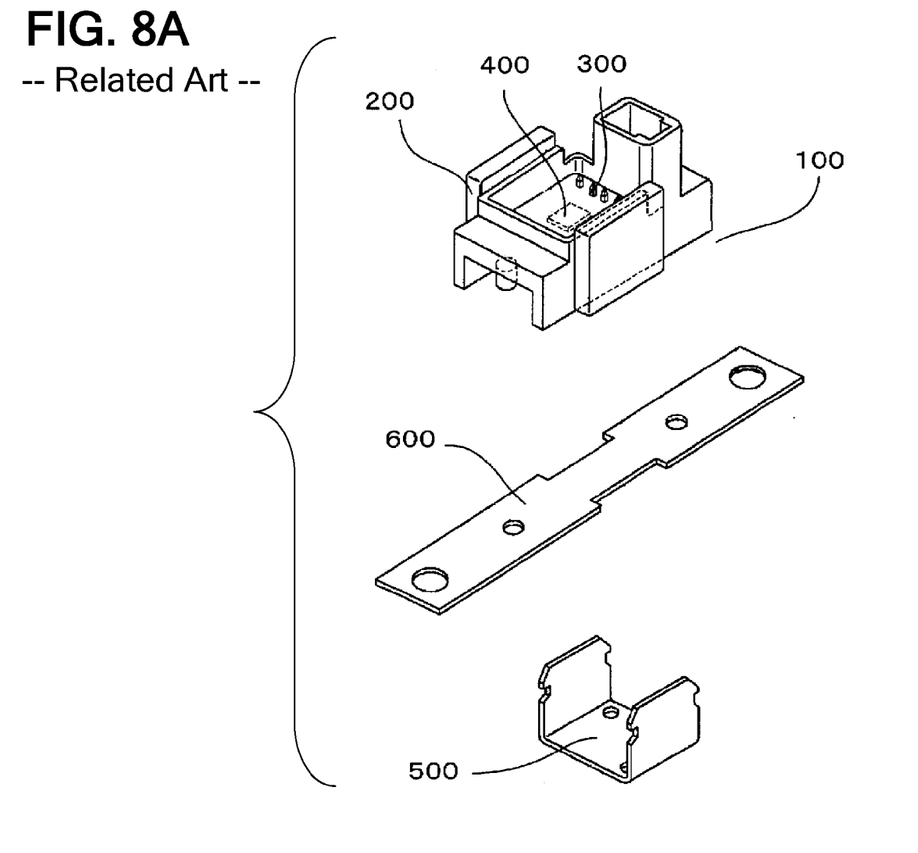
FIG. 8A is an exploded perspective view thereof and FIG. 8B is a longitudinal sectional view thereof.
Figure 8B:
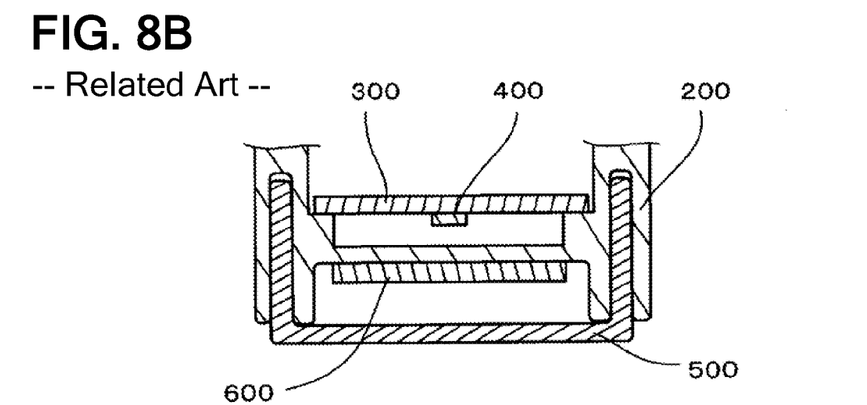

FIGS. 8A and 8B show a current sensor 100 according to a related art, FIG. 8A is an exploded perspective view thereof and FIG. 8B is a longitudinal sectional view of essential parts thereof. The current sensor 100 includes a housing 200 and a shield 500 fixed to the housing 200. Further, the current sensor 100 includes a current path 600 arranged between the housing 200 and the shield 500 to detect the current flowing through the current path 600. The current is measured by detecting the magnetic strength using a magnetic detection element 400 mounted on a substrate 300 attached to the housing 200 and outputting electric power corresponding to the magnetic strength. The shield 500 has a substantially U shape and completely surrounds the back side of the current path 600 (see FIG. 8B). With this configuration, it is possible to realize the current sensor 100 in which magnetic distortion do not occur and reliability is high. Although not disclosed in JP-A-2010-223868, FIG. 8B is prepared for clarifying the difference between the configuration of the present invention and the related art.

In the current sensor 100 disclosed in JP-A-2010-223868, particularly, the shield 500 completely covers the current path 600 from the back side thereof in the attachment portion of the current sensor 100. For this reason, there is a disadvantage that the eddy current is generated by the current flowing through the current path 600 and the phase of the magnetic field detected by the magnetic detection element 400 is delayed as compared to the phase of the current. Accordingly, there is a problem that reliability in a high-speed responsiveness is lowered. Further, in the large current of high frequency, magnetic saturation of the shield is expected and a linear relationship between the current and the magnetic flux density detected by the magnetic detection element 400 is broken. As a result, measurement within an allowable error range is difficult. Further, in the current sensor 100 according to the related art, it is possible to obtain a good response characteristic in the current detection of three-phase alternating current having a low peak value by shifting the position of the magnetic detection element to the left and right from the center of the current sensor. However, in this case, there is also a problem that the magnetic interference from the adjacent phase current path occurs.

Accordingly, the present invention has been made to solve the above-described problems and an object of the present invention is to provide a current sensor in which a high-speed responsiveness for detecting the magnetic field generated by the current flowing through the current paths of three-phase AC becomes good and therefore the reliability is high.

SUMMARY OF THE INVENTION

In order to achieve the above-described object, the current sensor according to the present invention is characterized by the following configurations.

(1) According to an aspect of the invention, a current sensor to be provided in a current path through which current flows, the current sensor includes a housing, a substrate accommodated in the housing, a plurality of magnetic detection elements mounted on the substrate, and a pair of shields respectively disposed on both sides of each magnetic detection element. The shields are accommodated in the housing so as to surround the current path on both sides of the current path and the shields are held so that respective end portions of the shields have a predetermined interval. The magnetic detection elements and the shields are disposed in each phase current path for three-phase AC.

(2) In the current sensor according of (1), each shield includes a flat plate-shaped support portion and a flat portion extending from the support portion in a direction substantially perpendicular to the support portion. The flat portions are arranged to cover a portion of the current path.

(3) In the current sensor of (2), the length of each flat portion is the same.

(4) In the current sensor of (3), each shield arranged in each phase current path has the same shape.

According to the current sensor of the above (1), the eddy current generated in the current path is suppressed and thus the phase delay of the magnetic field detected by the magnetic detection element is eliminated. Accordingly, it is possible to provide the current sensor in which a high-speed responsiveness is particularly good and the magnetic interference from the adjacent phase current path is suppressed.

According to the current sensor of the above (2), uniform current density distribution in the cross section of the current path is obtained and therefore the responsiveness of the magnetic detection element is improved.

According to the current sensor of the above (3), a residual magnetic field can be suppressed to reduce the offset error.

According to the current sensor of the above (4), the magnetic flux leaked from the adjacent phase current path is applied to the magnetic detection element only in a vertical direction and therefore the magnetic field phase error is reduced.

According to the present invention, since a pair of shields is provided and respective end portions thereof are spaced apart from each other, the eddy current occurring in the related art is suppressed and thus the phase delay of the magnetic field detected by the magnetic detection element is eliminated. Accordingly, it is possible to provide the current sensor for three-phase AC in which the responsiveness is improved, a high-speed responsiveness is good and the magnetic interference between respective phase current paths is suppressed.

Hereinabove, the present invention has been briefly described. In addition, details of the present invention will be further clarified by thoroughly reading a mode (hereinafter, referred to as an "illustrative embodiment") for carrying out the invention (which will be described below) with reference to the accompanying drawings.

BRIEF DESCRIPTION OF DRAWINGS

FIGS. 8A and 8B show a current sensor according to a related art.

DESCRIPTION OF EMBODIMENTS

Hereinafter, a preferred embodiment of the present invention will be described in detail with reference to the drawings.

A current sensor 10 according to an illustrative embodiment of the present invention is described with reference to FIG. 1 to FIG. 3.

Figure 1:
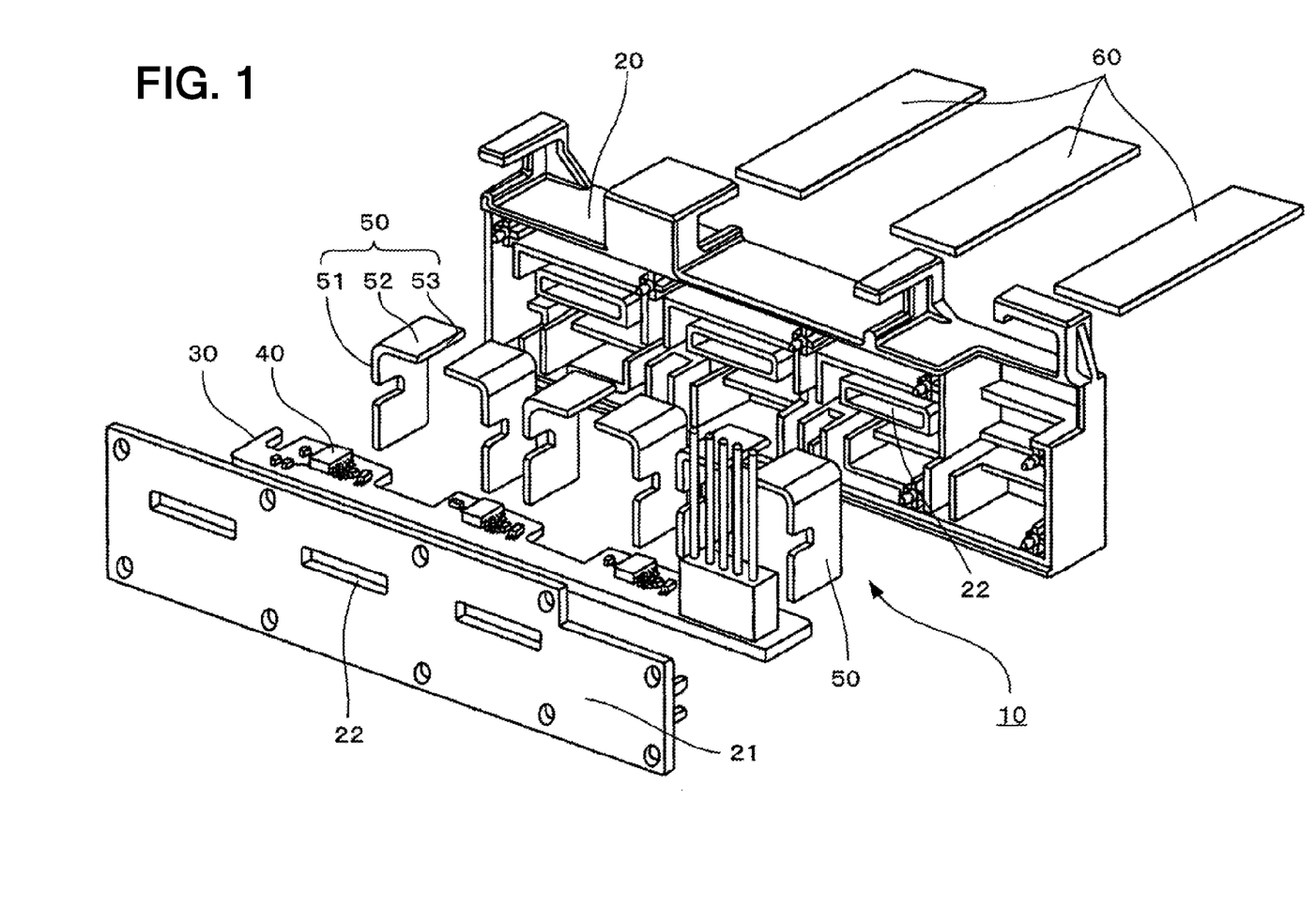
FIG. 1 is an exploded perspective view showing a current sensor according to an illustrative embodiment of the present invention.
Figure 2:
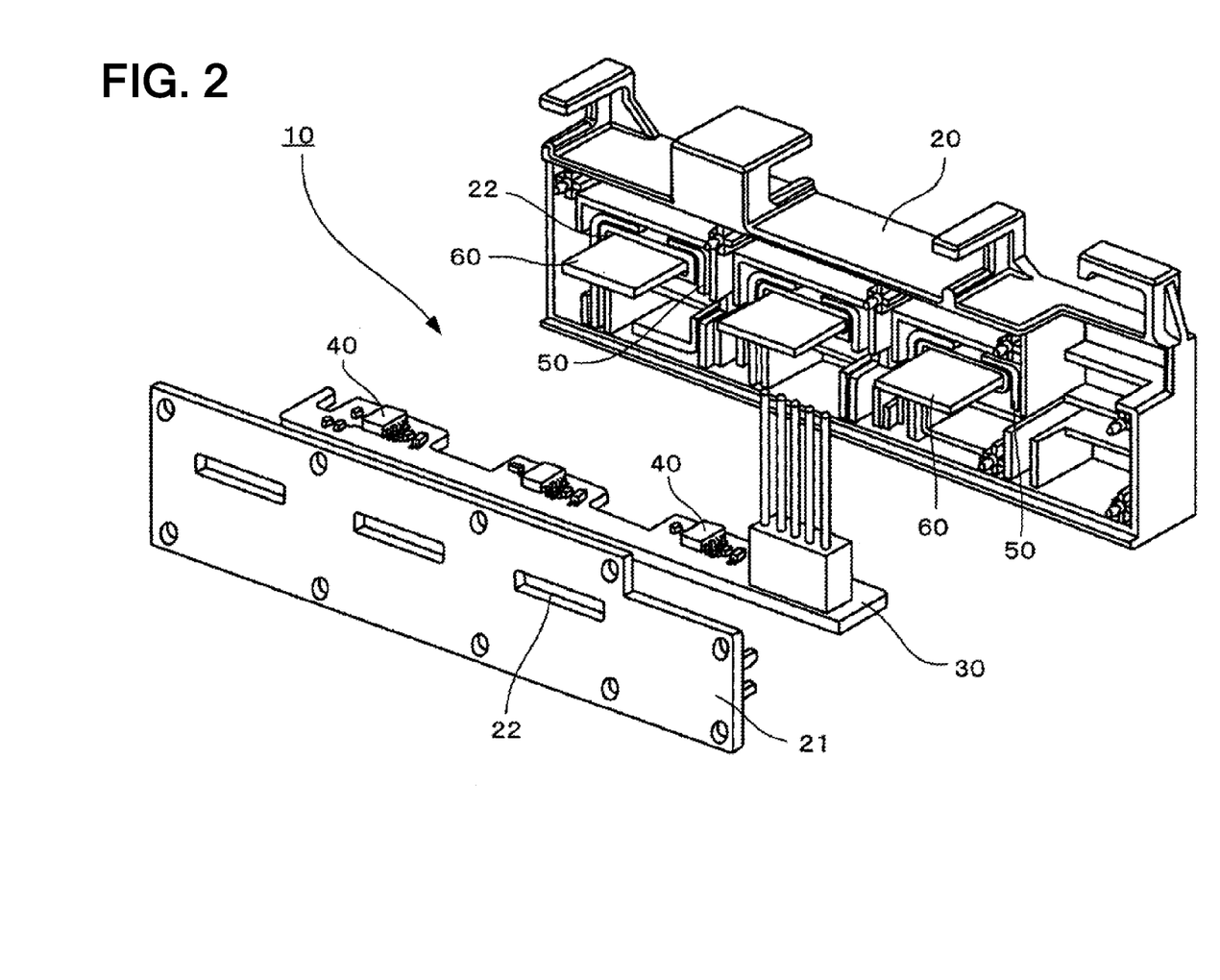
FIG. 2 is a perspective view showing the current sensor of FIG. 1 during assembly.
Figure 3:
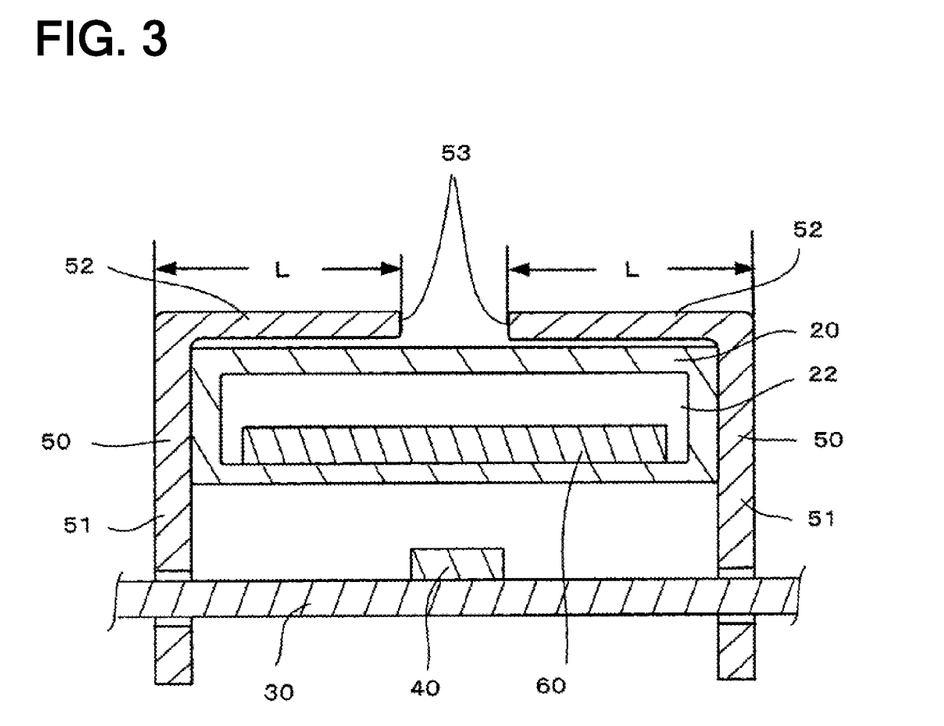
FIG. 3 is a longitudinal sectional view showing essential parts in V-phase current path of the current sensor of FIG. 1.

FIG. 1 is an exploded perspective view of the current sensor 10, FIG. 2 is a perspective view of the current sensor 10 during assembly and FIG. 3 is a longitudinal sectional view of essential parts in V-phase current path of the current sensor. The current sensor 10 includes a housing 20, a substrate 30 accommodated in the housing 20, magnetic detection elements 40 mounted to the substrate 30 and shields 50 accommodated in the housing 20. Further, the current sensor 10 includes current paths 60 arranged between the magnetic detection elements 40 and the shields 50 to detect the current flowing through the current paths 60. The current sensor 10 measures a drive current of a three-phase AC motor or a current of a connector connected to a three-phase AC path in electric vehicles or hybrid cars, for example.

The housing 20 has a substantially box shape and is formed from an insulative synthetic resin or the like. The current sensor 10 is completed in such a way that the substrate 30 and the shields 50 are accommodated and held at predetermined positions of the housing 20 from an opening side and a cover 21 is fixedly engaged to the opening side. The housing 20 and the cover 21 are respectively provided with a plurality of through-holes 22 and the current paths 60 are inserted through the through-holes 22. In this way, the current flowing through the current paths 60 can be detected. The magnetic detection elements 40 are mounted on the substrate 30 together with the circuits or the like and are adapted to measure the magnetic field occurring in the current paths 60. For example, the magnetic detection elements can include a semiconductor Hall element using Hall Effect caused by the Lorentz force to which carriers in the magnetic field are subjected or a magnetic impedance element using magnetic impedance effect caused by an amorphous magnetic material, etc. The current sensor 10 outputs a voltage value proportional to the magnetic field detected by the magnetic detection elements 40 via an amplifier circuit or the like mounted on the substrate 30. The shield 50 has a substantially thin-plate shape and formed from a material having a high magnetic permeability, such as a Permalloy or a silicon still sheet, for example. The current path 60 can include a flat plate-shaped bus bar or conductor through which alternating current or the like flows.

The current sensor 10 of the present invention is installed in three-phase AC type and therefore has the following configurations.

The current path 60 includes three current paths (U-phase, V-phase and W-phase from the right side of FIG. 1) of three-phase AC and the magnetic detection elements 40 for detecting the current flowing through the current paths 60 are also disposed to each phase of the current path 60. Further, respective magnetic detection elements 40 are integrally mounted on a single substrate 30. A pair of shields 50 is arranged to correspond to each of the magnetic detection elements 40 and to individually surround the magnetic detection element 40 and the current path 60. Each of the current paths 60 is arranged in respective through-holes 22 which are provided in the housing 20 and the cover 21. In the illustrative embodiment of the present invention, the current path 60 is arranged between the magnetic detection element 40 and the shield 50 (see FIG. 3).

Each of the shields 50 has the same shape of a substantially L-shape and a pair of left and right shields 50 is provided for one magnetic detection element 40 and one current path 60 corresponding to the magnetic detection element. Further, a pair of shields 50 is respectively accommodated and arranged in the housing 20 so as to surround the through-holes 22 of the housing 20 on both sides. In addition, each of the shields 50 includes a flat plate-shaped support portion 51 arranged on both sides of the magnetic detection element 40 and the current path 60, a flat portion 52 extending in a direction substantially perpendicular to the support portion 51 and an end portion 53 provided at a leading end of the flat portion 52. That is, the flat portion 52 is protruded toward the center of the through-hole 22. Here, respective end portions 53 of the flat portions 52 of the shields 50 are accommodated and arranged in the housing 20 so as to face each other and to be spaced apart from each other. Accordingly, a part of the current path 60 is covered and concealed by the flat portion 52. In other words, it can be said that the shields 50 do not completely surround the current path 60 from the back side thereof and an opening portion (slit) having a predetermined interval is provided therebetween.

More specifically, the magnetic detection element 40 mounted on the substrate 30 is accommodated and held in the housing 20 so that the magnetic detection element is positioned in the center of the through-hole 22. As a result, the magnetic detection element 40 is disposed in the center of the current path 60 inserted through the through-hole 22. Further, since the shields 50 disposed on both left and right sides of the magnetic detection element 40 have a bilaterally symmetrical shape and the length L of each flat portion 52 thereof is the same in the left and right shields, the magnetic detection element 40 is disposed in the center of the left and right shields 50 at the same time. Although the V-phase current path has been described in FIG. 3, the same is similarly applied to the U-phase and V-phase current paths.

The shape of the shield 50 and the positional relationship of the magnetic detection element 40 as described above are common in the U-phase, V-phase and W-phase current paths. Accordingly, by suppressing the eddy current generated in the current path 60 and thus eliminating the phase delay of the magnetic field detected by the magnetic detection element 40, it is possible to provide the current sensor 10 in which a high-speed responsiveness is particularly good and the magnetic interference from the adjacent phase current path is suppressed. Further, uniform current density distribution in the cross section of the current path 60 is obtained and therefore the responsiveness of the magnetic detection element 40 is improved. In addition, a residual magnetic field can be suppressed to reduce the offset error. Furthermore, the magnetic flux leaked from the adjacent phase current path 60 is applied to the magnetic detection element 40 only in a vertical direction and therefore the magnetic field phase error is reduced.

Figure 4A:
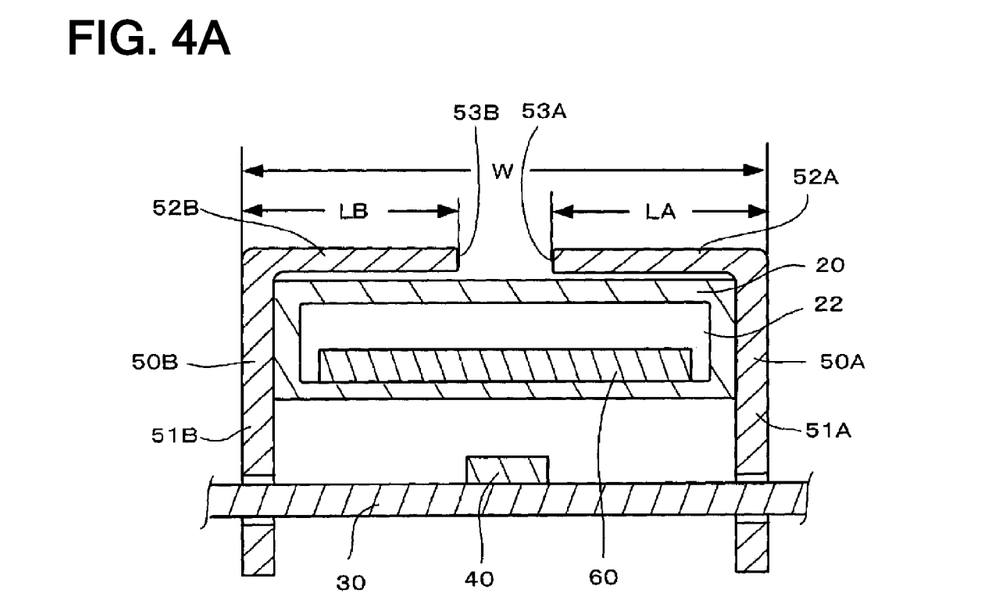
FIG. 4A is a longitudinal sectional view similar to FIG. 3
Figure 4B:
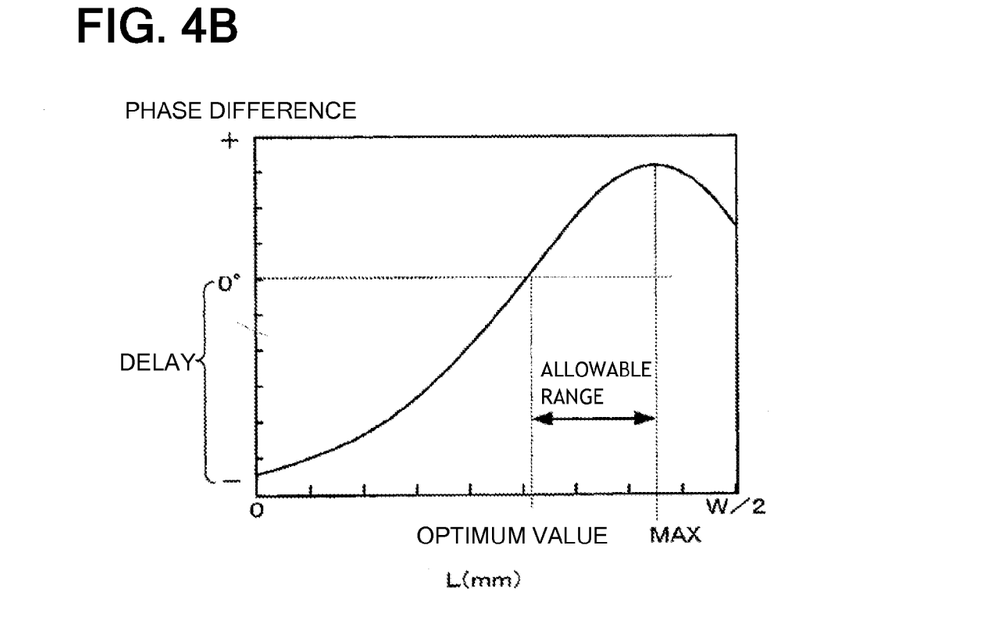
FIG. 4B is a graph showing a phase difference due to the length of a flat portion of a shield.

FIG. 4A is a longitudinal sectional view similar to FIG. 3 and FIG. 4B is a graph obtained by measuring a phase difference due to the length L of the flat portion 52. In order to explain the graph of FIG. 4B, the shield 50 on the right side of FIG. 4A is represented as "a first shield 50A" and the shield 50 on the left side of FIG. 4A is represented as "a second shield 50B". Since the shape and arrangement of each shield 50 are common in the illustrative embodiment, the shield 50 disposed in the V-phase current path 60 is described in detail as an example.

The length of a flat portion 52A of the first shield 50A is represented as "LA" and the length of a flat portion 52B of the second shield 50B is represented as "LB". Further, the distance between the end face of the first shield 50A and the end face of the second shield 50B is represented as "W". In the illustrative embodiment, LA is equal to LB. It can be understood from the graph of FIG. 4B that an optimum state of the phase difference is found by changing the length L (LA, LB) of the flat portion 52. Although the eddy current is generated in the current path 60 when the alternating current is supplied and thus the phase of the magnetic field detected by the magnetic detection element 40 is delayed as compared to the phase of the current flowing through the current path 60, the delay of the phase can be eliminated by adjusting the length L of the flat portion 52.

Figure 5A:
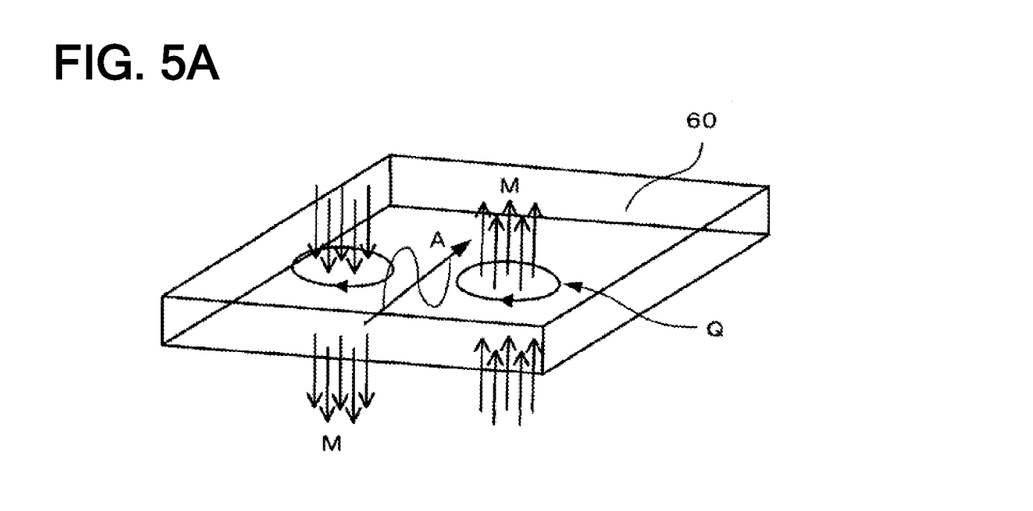
FIG. 5A is an explanatory view showing a magnetic field occurring in the current path when a shield is not provided and FIG. 5B is an explanatory view showing a magnetic field occurring when a shield of the present invention is provided.
Figure 5B:
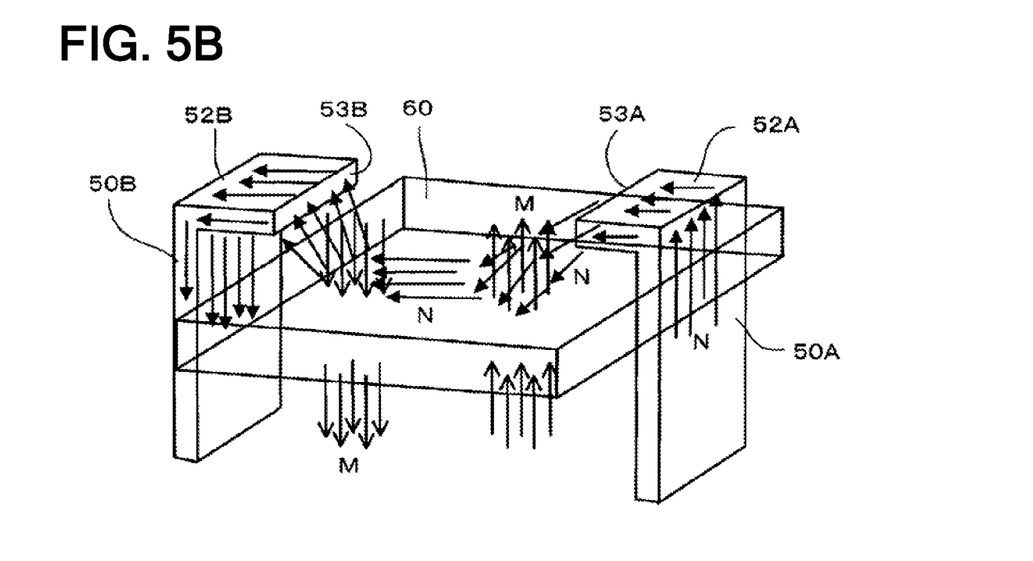

In the graph shown in FIG. 4B, a vertical axis represents the phase difference and a horizontal axis represents the length L of the flat portion 52. Further, measurement result of changes (referring to "curve graph") in the phase of the center magnetic field according to the length L is graphed in FIG. 4B. A point with no delay in the phase difference is defined as 0° (where the responsiveness of the magnetic detection element 40 is good), the length L of the flat portion 32 at the intersection of the curve and a straight line of the phase difference 0° is defined as an optimum value and the length L of the flat portion 32 at the maximum value of the curve is defined as MAX. From this graph, it is understood that a desirable range (allowable range) of the length L of the flat portion 32 is ranged from the optimum value to the MAX. Additionally, from this graph, it can be said that a strong correlation exists between the length L of the flat portion 52 and the improvement effect of the responsiveness. Accordingly, it is possible to perform an optimum phase control design by adjusting the length L of the flat portion based on the frequency to be used and the maximum peak current. This effect is the same in the U-phase and W-phase current paths FIGS. 5A and B are explanatory views schematically showing a state where the magnetic field is changed by the shield 50 of the present invention.

When the current A of sinusoidal AC progresses in the direction (from the front to the rear in FIG. 5) of arrow through the current path 60, a magnetic field M having a strength corresponding to the change rate in the magnitude of the current over time is generated and an eddy current Q is generated around the magnetic field M. The magnetic field M becomes an alternating magnetic field in which the magnitude and direction thereof are repeatedly changed over time when the current A is alternating current. When the shield 50 is not provided around the current path 60 as shown in FIG. 5A, a residual magnetic field is generated and therefore the detection of the magnetic detection element 40 is delayed. When the first shield 50A and the second shield 50B (see FIG. 5B) are provided around the current path 60 and each of the flat portions 52A, 52B of the first shield 50A and the second shield 50 B extends toward the center of the current path 60, a magnetic field N is generated from the end portion 53A of the flat portion 52A of the first shield 50A to the end portion 53B of the flat portion 52A of the second shield 50B. As the magnetic field N traverses the current path 60, cancellation of the magnetic field is caused between the magnetic field N and the magnetic field M generated in the current path 60. As a result, the residual magnetic field is suppressed and therefore it is possible to prevent occurrence of the eddy current. Further, the current density distribution in the cross section of the current path 60 becomes uniform and therefore the delay of the detection response of the magnetic detection element 40 is eliminated. This effect is the same in the U-phase and W-phase current paths. Meanwhile, although only one direction has been described, the direction of the magnetic field alternates in a short time when the current is alternating current.

Figure 6A:
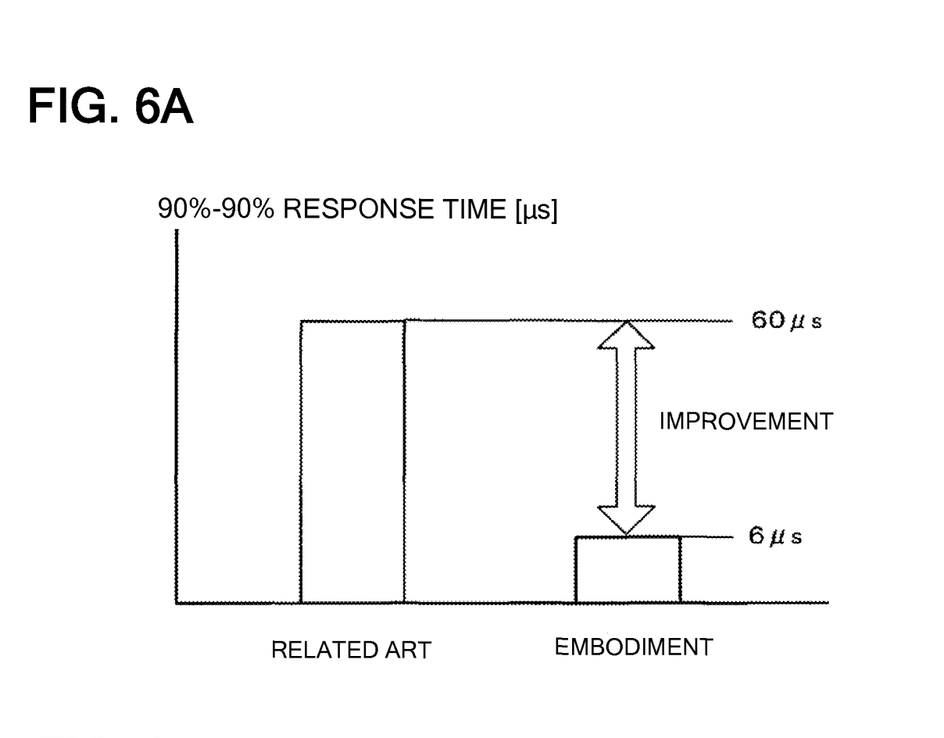
FIG. 6A is a comparison graph showing 90%-90% response time in a related art and an illustrative embodiment of the present invention and FIG. 6B is a graph for explaining the 90%-90% response time.
Figure 6B:
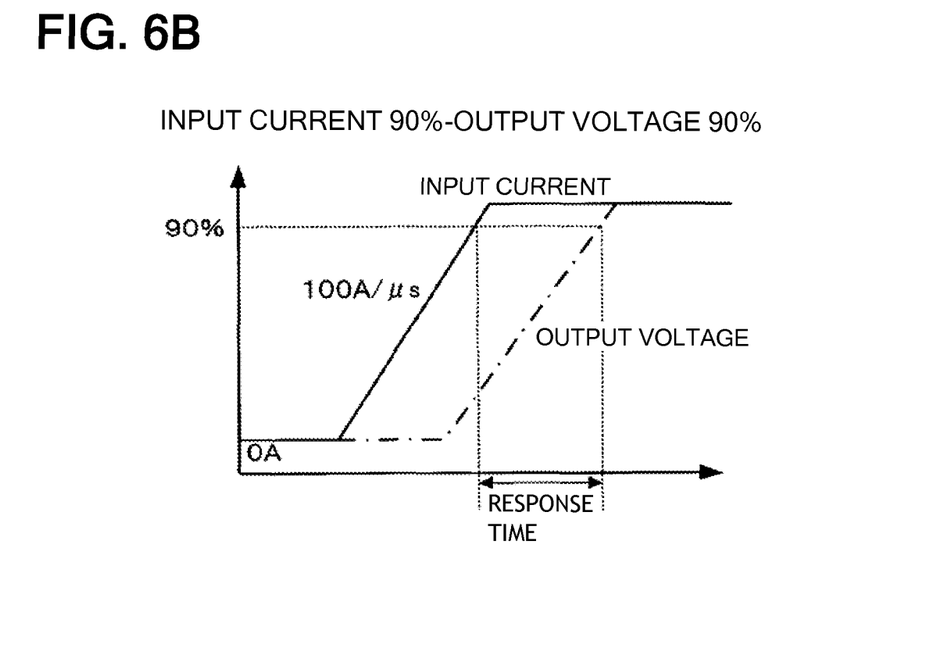

FIG. 6A is a comparison graph showing 90%-90% response time in a related art and the illustrative embodiment of the present invention. As shown in FIG. 6B, the 90%-90% response time refers to a response time when a voltage value (output voltage 90%) proportional to the magnetic field corresponding to the output of the current is measured by the magnetic detection element 40, with respect to 90% output of the current (input current) flowing through the current path 60. In the actual measurement results based on FIG. 6A, the response time is improved from 60 μs of a related art to 6 μs (response time 6 μs corresponds to a theoretical value of a magnetic detection element used in the actual measurement) of the present invention (about 90% improvement). As is apparent from this result, the effect owing to the configuration of the shields 50 has appeared clearly and the responsiveness of the magnetic detection element 40 is improved. Particularly, it is possible to secure a high-speed responsiveness.

Figure 7A:
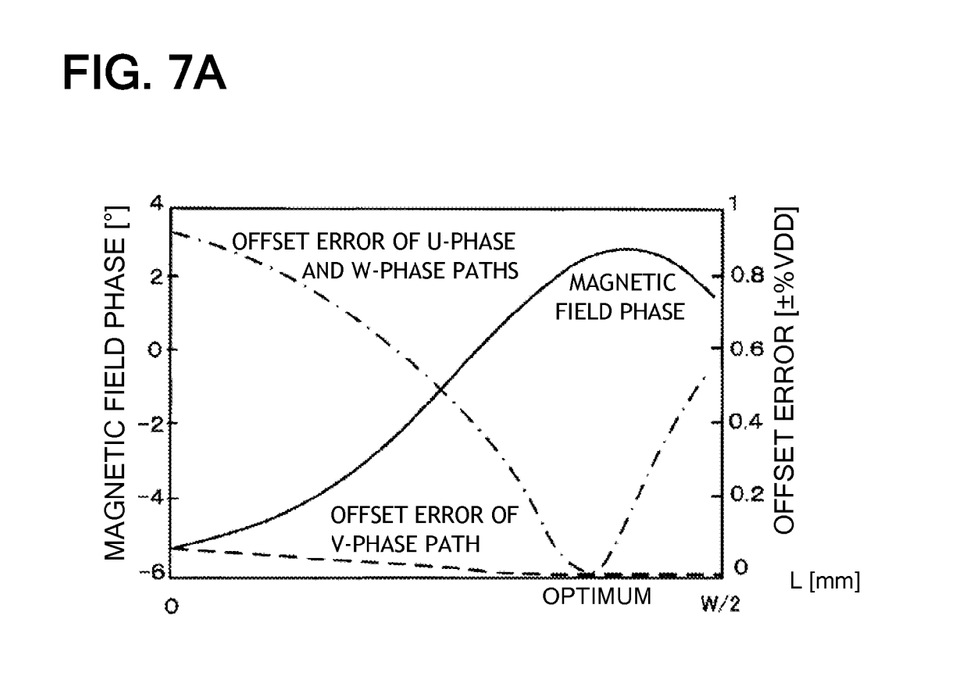
FIG. 7A is a graph showing a magnetic field phase and an offset error due to the length of a flat portion of the shield according to the present invention and Fig .7B is a graph showing the performance in the current value and the magnetic flux density.
Figure 7B:
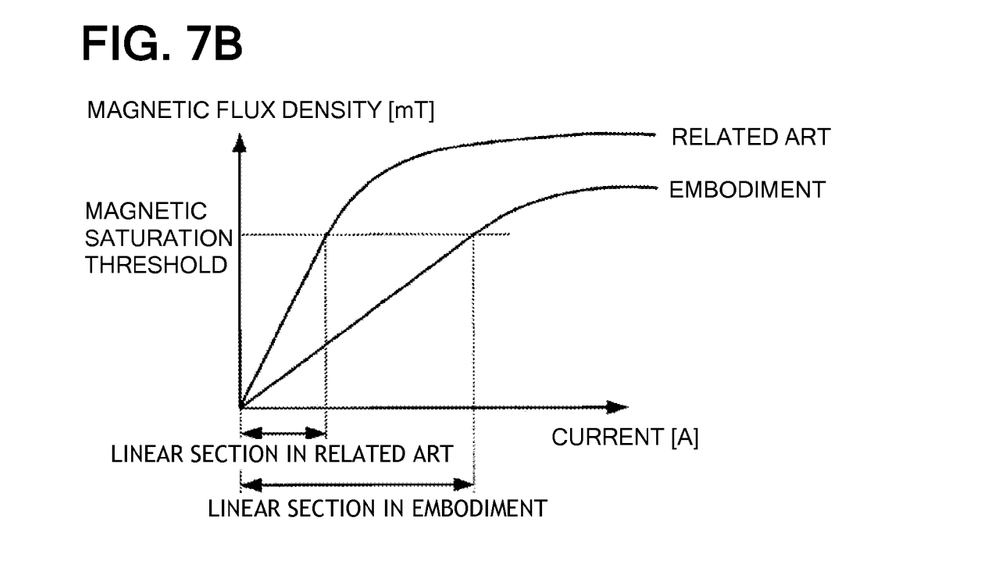

FIG. 7A is a graph showing a magnetic field phase and an offset error due to the length of the flat portion 52 of the shield 50 according to the present invention and FIG. 7B is a graph showing the performance in the current value and the magnetic flux density.

In the graph of FIG. 7A, a left vertical axis represents a magnetic field phase [°], a right vertical axis represents an offset error [±%Vdd] and a horizontal axis represents the length L of the flat portion 52. A solid line represents the magnetic field phase (common in each phase), a broken line represents the offset error of the V-phase current path and a dashed line represents the offset error of the U-phase and W-phase current paths. The following points are understood from this graph. As the length L of the flat portion 52 becomes longer, the magnetic field phase is changed from − (minus) to + (plus) (referring to a solid curve) and a phase delay is improved. Meanwhile, an offset error is seen in the U-phase and W-phase current paths. For example, when an initial phase in three-phase current path is different from each other in such a way that the U-phase current path of phase 0° is 0 [A], the V-phase current path of phase 120° is 510 [A] and the W-phase current path of phase −120° is −510 [A], the magnetic field of the V-phase and W-phase current paths leaking from the current sensor is propagated to the U-phase current path and therefore an offset error is generated in the U-phase current path. Similarly, the magnetic field of the V-phase and U-phase current paths leaking from the current sensor is propagated to the W-phase current path and therefore an offset error is generated in the W-phase current path. As the flat portion 52 becomes longer, the offset error caused in this way is reduced and can approach an ideal reference value. Particularly, it can be seen that the length L has an "optimal" value at the minimum value of the offset error, in the U-phase and W-phase current paths. The reason why the offset error is reduced in this way is that the flat portion 52 shifts a magnetic field vector obtained by synthesis with the magnetic field leaked from another phase current path in a vertical direction and the magnetic field vector shifted in the vertical direction is not measured by the magnetic detection element 40. For example, although the magnetic field leaked from the shields 50 of the V-phase and W-phase current paths is propagated to the U-phase current path, the flat portions 52 of the shields 50 located in the U-phase current path shift a magnetic field vector obtained by synthesis with the magnetic field leaked from the V-phase current path and the magnetic field leaked from the W-phase current path in a vertical direction and the magnetic field vector shifted in the vertical direction is not measured by the magnetic detection element 40 arranged in the U-phase current path. The degree of shifting the magnetic field vector is determined in accordance with the length L of the flat portions 52. Particularly, the length L has an "optimal" value at the minimum value of the offset error in the U-phase and W-phase current paths.

Further, in the graph of FIG. 7A, the changes in the offset error of the V-phase current path are held in a low level, regardless of the length L. The reason is that since the V-phase current path is located in the middle of the U-phase current path and the W-phase current path, in other words, the U-phase current path and the W-phase current path are arranged in symmetrical positions with respect to the V-phase current path, the magnetic fields propagated from the U-phase current path and the W-phase current path are canceled each other in the V-phase current path.

Hereinabove, by placing a pair of left and right L-shaped shields 50, an offset error is reduced and an output error is reduced in the U-phase and W-phase current paths. Further, since the current flowing through the V-phase current path has the same different directions as the U-phase and W-phase current paths 60, a vector of magnetic field which is leaked from both phase current paths and received by the magnetic detection element 40 is bilaterally symmetric, an amount thereof in the left and right directions is cancelled and a magnetic interference is suppressed. As a result, output thereof does not give an offset error.

In the graph of FIG. 7B, a vertical axis represents a magnetic flux density [mT] and a horizontal axis represents a current [A]. As is understood from this graph, magnetic saturation is likely to occur when the current [A] becomes larger (referring to the curve). However, in the present invention, occurrence of the magnetic saturation is suppressed even when the large current of high frequency flows, so that it is possible to extend a section (linear section) in which linearity is held. By referring to a relationship between the magnetic flux density [mT] and the current [A] in FIG. 7B, a section considered as the linear section is dependent on the length L of the flat portions 32 which is described with reference to FIG. 4B. As the length of the flat portions 32 approaches the MAX, the extended linear section is shrunk to 0. Thus, also in FIGS. 7A and B, the effect of the structure of the shields 50 according to the present invention is significant.

In addition, the present invention is not limited to the above-described illustrative embodiments and various modifications and improvements may be made to the illustrative embodiments. Furthermore, materials, shapes, dimensions, numerical values, forms, numbers and locations of each component in the above-described illustrative embodiments are not limited but may be arbitrarily set, as long as the object of the present invention can be achieved.

What is claimed is:

1. A current sensor to be provided in a current path through which current flows, the current sensor comprising:
a housing;
a substrate accommodated in the housing;
a plurality of magnetic detection elements mounted on the substrate; and
a pair of a plurality of shields including a first shield and a second shield, respectively disposed on both sides of each magnetic detection element, and accommodated in the housing,
wherein the pair of shields including the first shield and the second shield is accommodated in the housing so as to surround the current path on both sides of the current path and the shields are held so that respective end portions of the first shield and the second shield have a predetermined interval,
wherein the magnetic detection elements and the shields are disposed in each phase current path for three-phase AC, and
wherein the first shield and the second shield are symmetric.

2. The current sensor according to claim 1, wherein each shield includes a flat plate-shaped support portion and a flat portion extending from the support portion in a direction substantially perpendicular to the support portion, and
wherein the flat portions are arranged to cover a portion of the current path.

3. The current sensor according to claim 2, wherein the length of each flat portion is the same.

4. The current sensor according to claim 3, wherein each shield arranged in each phase current path has the same shape.

5. The current sensor according to claim 1, wherein the pair of shields each have a substantially L-shaped and are configured to face each other such that a magnetic detection element of the plurality of magnetic detection elements is disposed in between the pair of shields.

6. The current sensor according to claim 2, wherein the flat portions of the pair of shields face each other.

* * * * *